United States Patent
Matsuyama (10) Patent No.: US 7,446,353 B2
(45) Date of Patent: Nov. 4, 2008

(54) SOLID-STATE IMAGING APPARATUS AND CHARGE TRANSFER APPARATUS

(75) Inventor: Eiji Matsuyama, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 136 days.

(21) Appl. No.: 11/053,259

(22) Filed: Feb. 9, 2005

(65) Prior Publication Data

US 2005/0173736 A1    Aug. 11, 2005

(30) Foreign Application Priority Data

Feb. 9, 2004    (JP)    ............................. 2004-032033

(51) Int. Cl.
*H01L 27/148*    (2006.01)
*H01L 29/768*    (2006.01)

(52) U.S. Cl. ..................... 257/250; 257/233; 257/448; 257/E27.151

(58) Field of Classification Search .............. 257/233, 257/250, 448, E27.151
See application file for complete search history.

(56) References Cited

U.S. PATENT DOCUMENTS

| | | | | |
|---|---|---|---|---|
| 4,539,596 A | * | 9/1985 | Elabd | .......................... 348/316 |
| 4,589,005 A | * | 5/1986 | Matsuda et al. | ............. 257/250 |
| 4,639,940 A | * | 1/1987 | Ohtsuki | ......................... 377/60 |
| 5,237,191 A | * | 8/1993 | Yonemoto et al. | ........... 257/249 |
| 5,286,989 A | * | 2/1994 | Yonemoto | .................... 257/239 |
| 5,365,093 A | * | 11/1994 | Kuno | .......................... 257/233 |
| 5,583,071 A | * | 12/1996 | Stevens et al. | ................. 438/76 |
| 6,207,981 B1 | * | 3/2001 | Hatano et al. | ................ 257/221 |

FOREIGN PATENT DOCUMENTS

JP    58-137250    8/1983
JP    2816063    8/1998

OTHER PUBLICATIONS

Sei, Hideo, et al., "A Meander Channel CCD Linear Image Sensor", Feb. 2, 1978, IEDM, vol. ED-25, No. 2, p. 140-4.*
CCD Image Sensor and Analog Signal Processor, The Transactions of The Institute of Electronics, Information and Communication Engineers, Apr. 1977, ED77-2 pp. 9-16.

* cited by examiner

*Primary Examiner*—Howard Weiss
(74) *Attorney, Agent, or Firm*—Young & Thompson (57) ABSTRACT

A solid-state imaging apparatus includes a photoelectric conversion section generating a charge by photoelectric conversion; and a charge transfer section having first and second transfer electrodes arranged in parallel with each other in an output direction of a charge generated by the photoelectric conversion section and repeatedly transferring the charge between a semiconductor region underneath the first transfer electrode and a semiconductor region underneath the second transfer electrode obliquely to an array direction of the first and second transfer electrodes to output the charge.

16 Claims, 8 Drawing Sheets

RELATED ART

Fig. 8A

RELATED ART

Fig. 8B

RELATED ART

SOLID-STATE IMAGING APPARATUS AND CHARGE TRANSFER APPARATUS

BACKGROUND OF THE INVENTION

1. Field of the Invention

The present invention relates to solid-state imaging apparatus and particularly to a solid-state imaging apparatus having a charge transfer section which transfers charges generated by a photoelectric conversion section.

2. Description of Related Art

A charge coupled device (CCD) image sensor formed on a semiconductor substrate and having a charge transfer function is widely used in faxes, scanners, copy machines, digital cameras and so on. The CCD image sensor sequentially outputs the signal charges accumulated according to the amount of light received by a photodetector such as a photodiode, thereby obtaining image information.

Figure 6:
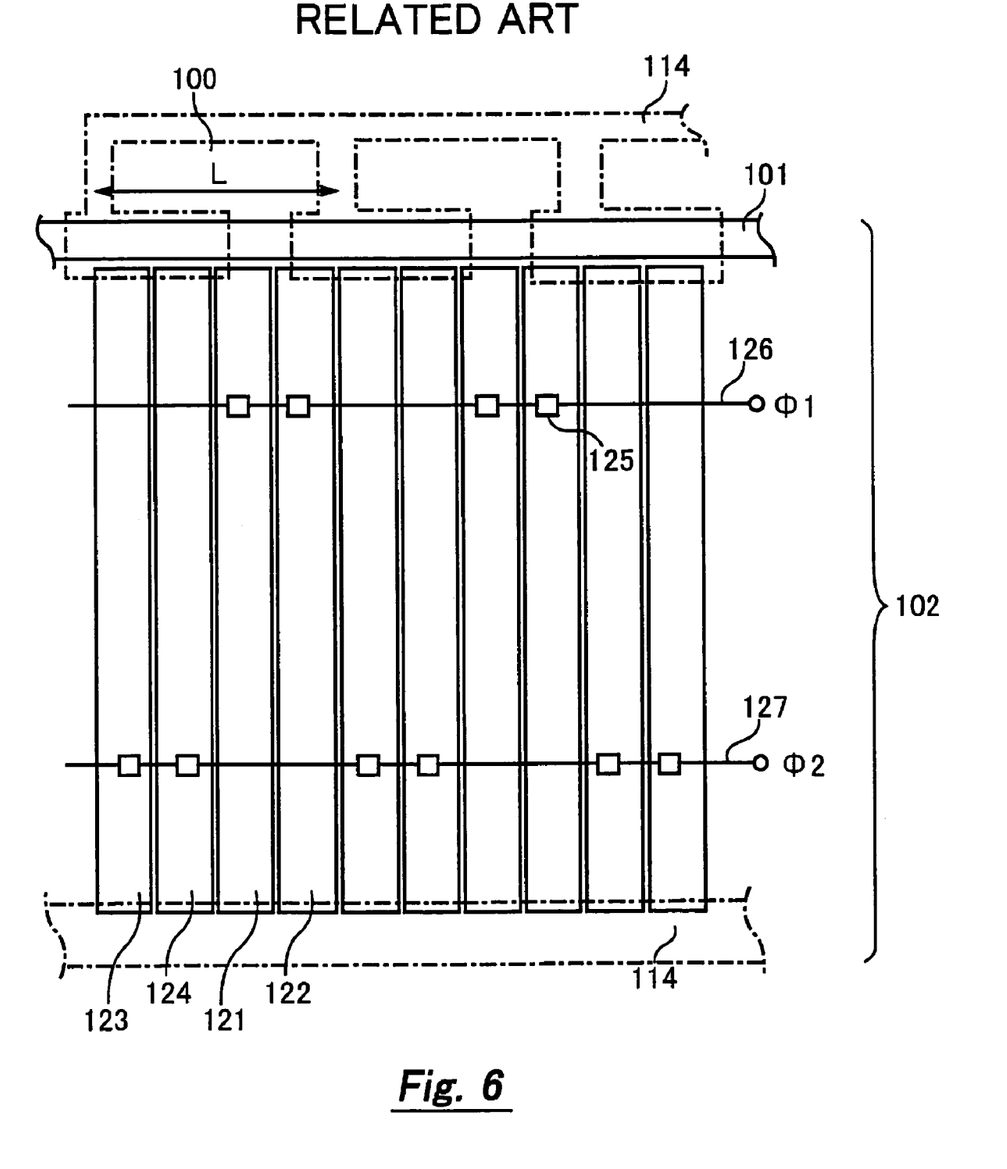
FIG. 6 is a plan view of a conventional CCD image sensor.

FIG. 6 is a plan view of a conventional CCD image sensor. The CCD image sensor includes photodiodes 100, a transfer gate electrode 101, and a CCD register 102. A charge detection section and an output circuit, not shown, are placed in one end of the CCD register 102.

The CCD image sensor is a one-dimensional image sensor which includes a photodiode line array consisting of a plurality of photodiodes 100 lined up in one direction. The photodiodes 100 are separated from each other by an element separating region 114 formed of a p+ type diffusion layer. The transfer gate electrode 101 is placed between the photodiodes 100 and the CCD register 102.

In the CCD register 102, four types of electrodes 121 to 124 are arranged repeatedly. The electrode 121 is a Φ1 storage electrode, the electrode 122 is a Φ1 barrier electrode, the electrode 123 is a Φ2 storage electrode, and the electrode 124 is a Φ2 barrier electrode. The electrodes 121 to 124 are connected to a metal line 126 or 127 by a contact 125 to receive a drive pulse Φ1 or Φ2. If a pitch of a unit cell in an electron output direction is L, a set of the four electrodes 121 to 124 corresponds to the pitch L.

Drive pulses Φ1 and Φ2, which are clock pulses with 180° phase difference from each other, are applied to the terminals Φ1 and Φ2, respectively. The potential underneath the electrodes 121 to 124 thereby changes to sequentially transfer electrons from right to left of FIG. 6 in the extending direction of the electrodes 121 to 124 and the metal lines 126 and 127.

One of the main characteristics of the CCD is resolution. Improvement of the resolution requires an increase in the number of photodiodes. Further, improvement of the resolution while keeping the same chip size requires a decrease in the size of a unit cell.

However, the configuration of FIG. 6 places the four electrodes 121 to 124 within the pitch L of a unit cell. Reduction of the unit cell size is thereby restricted by a design rule about electrode layout and a design rule about a connection of each electrode and a metal line such as the size of a contact, the inner margin of the end of a contact from the end of an electrode and so on, hindering the improvement of the resolution.

As a technique for providing a higher resolution CCD image sensor with the same design rule as in FIG. 6, a CCD image sensor which transfers electrons as turning them back is known. This technique is disclosed in Osamu Ohtsuki, "CCD IMAGE SENSOR AND ANALOG SIGNAL PROCESSOR", The Transactions of The Institute of Electronics, Information and Communication Engineers, April 1977, ED77-2, pp. 9-16, for example.

Figure 7:
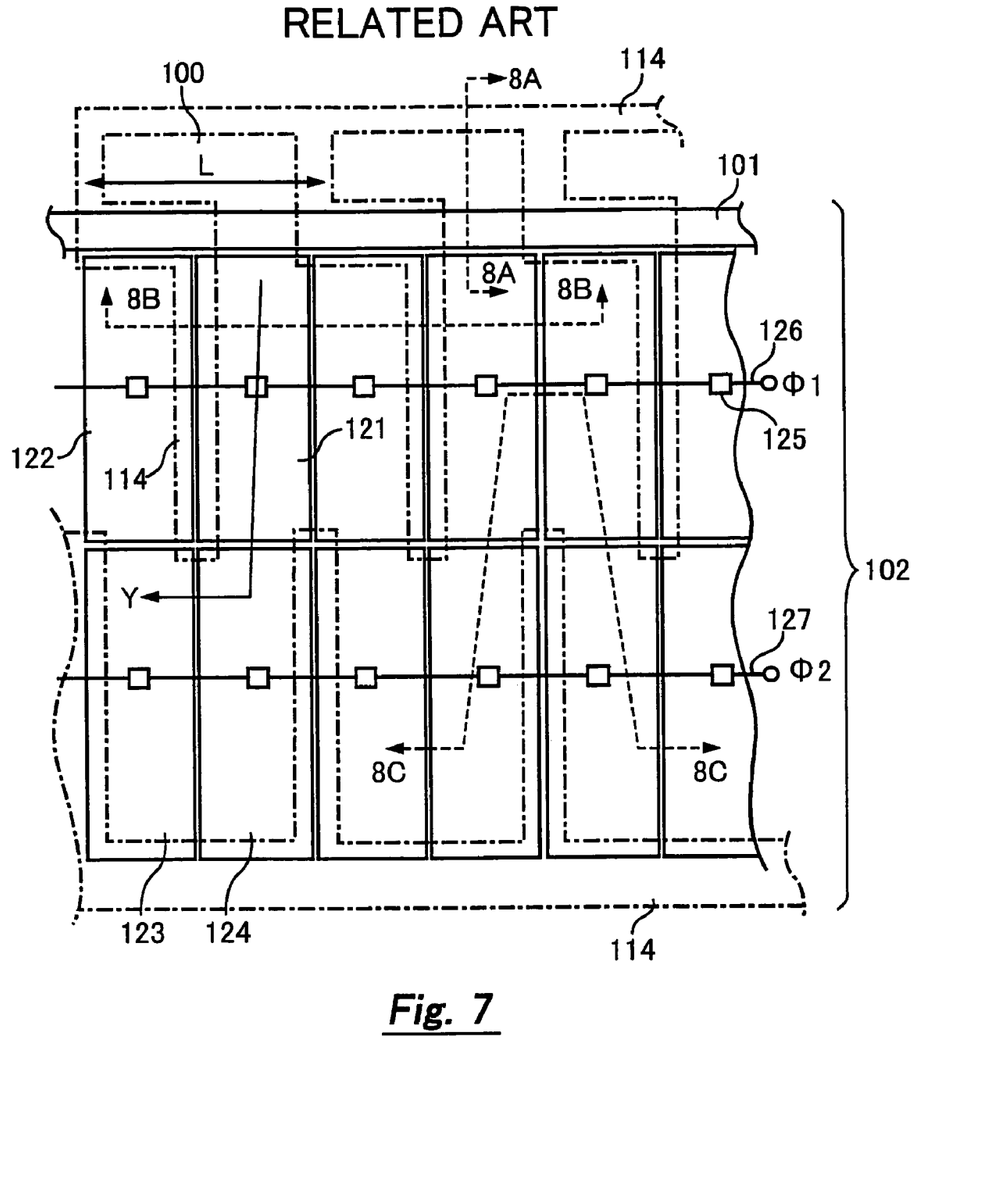
FIG. 7 is a plan view of a conventional CCD image sensor.

FIG. 7 is a plan view of another conventional CCD image sensor. The CCD image sensor also includes the photodiodes 100, the transfer gate electrode 101, and the CCD register 102.

In the CCD register 102, Φ1 storage electrodes 121 and Φ1 barrier electrodes 122 are arranged repeatedly in parallel with a photodiode line array. Further, Φ2 storage electrodes 123 and Φ2 barrier electrodes 124 are arranged repeatedly in parallel with the electrodes 121 and 122. An element separating region 114 is formed in the part of the boundaries between the Φ1 barrier electrode 122 and the Φ1 storage electrode 121 which has the Φ1 barrier electrode 122 to the left and the Φ1 storage electrode 121 to the right. The element separating region 114 is also formed in the part of the boundaries between the Φ2 barrier electrode 124 and the Φ2 storage electrode 123 which has the Φ2 barrier electrode 124 to the left and the Φ2 storage electrode 123 to the right.

The CCD register 102 thereby transfers electrons as turning them back in the vertical direction of the figure.

In this CCD image sensor, two electrodes of the electrodes 121 to 124 correspond to the pitch L of a unit cell. Though FIG. 7 shows the case where the electrodes 121 and 122 and the electrodes 123 and 124 are respectively separated in order to clarify the number of electrodes corresponding to the pitch L, those electrodes may be connected.

Figure 8A:
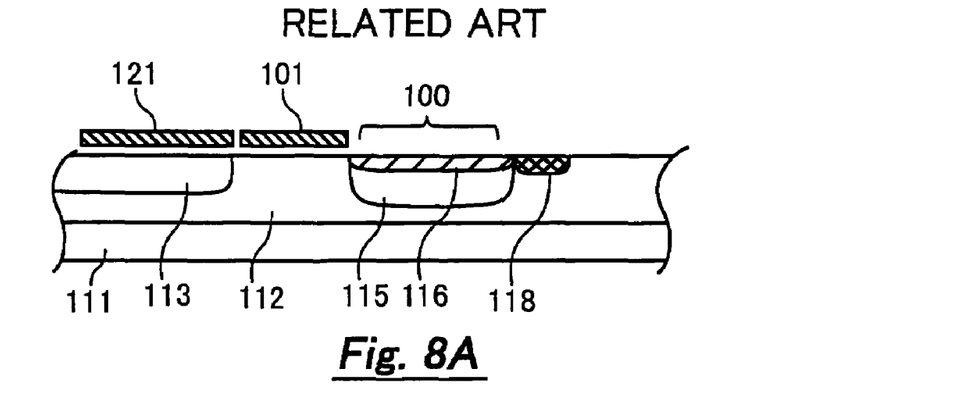
FIG. 8 is a cross-sectional view of a conventional CCD image sensor.
Figure 8B:
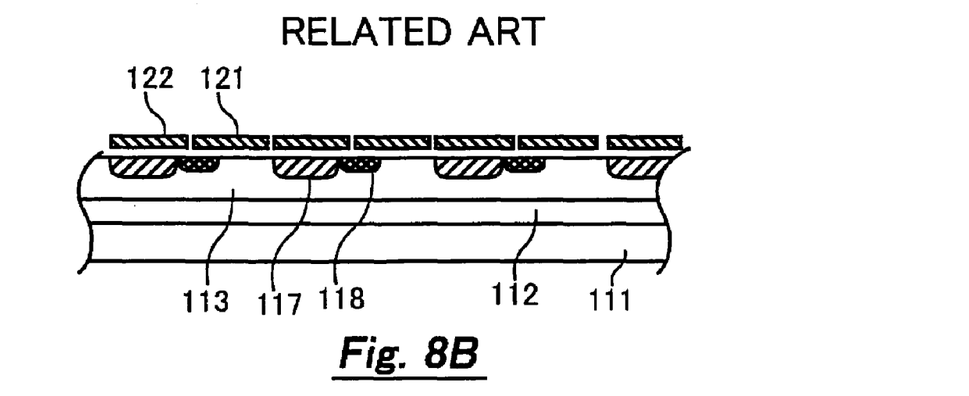
Figure 8C:
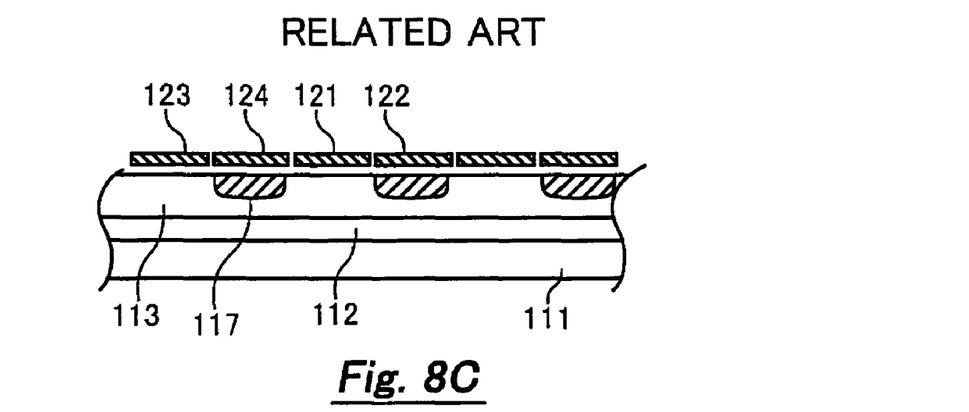

FIGS. 8A to 8C are cross-sectional views along the lines 8A-8A, 8B-8B, and 8C-8C of FIG. 7, respectively. As shown in FIG. 8A, a p-type well 112 is formed on one principal surface of an n-type substrate 111. In the p-type well 112, an n type well 113 which serves as a transfer channel of the CCD register 102, a p+ type diffusion layer 118 which serves as the element separating region 114, and an n type diffusion layer 115 which serves as a charge accumulation layer of the photodiode 100 are formed. Further, a p+ type diffusion layer 116 is formed on the surface of the n type diffusion layer 115 to reduce a dark current.

Further, as shown in FIGS. 8B and 8C, an n− type diffusion layer 117 is formed in the n type well 113 by partial boron ion implantation or the like. The n− type diffusion layer 117 serves as a barrier region.

Figure 9A:
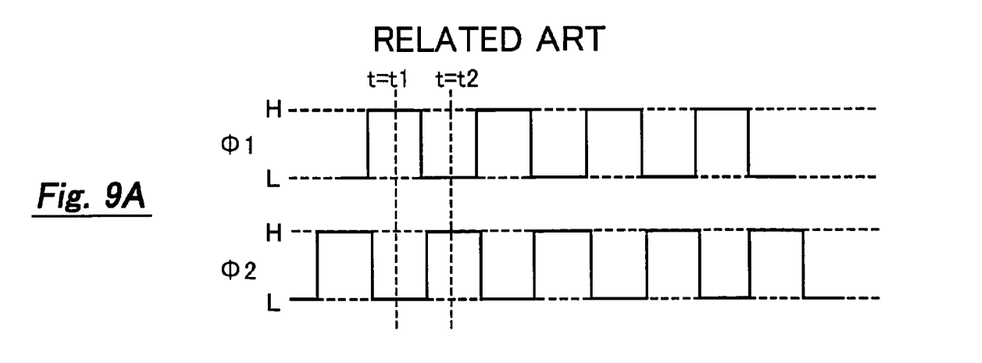
FIG. 9A is a drive pulse timing chart of a conventional CCD image sensor.
Figure 9B:
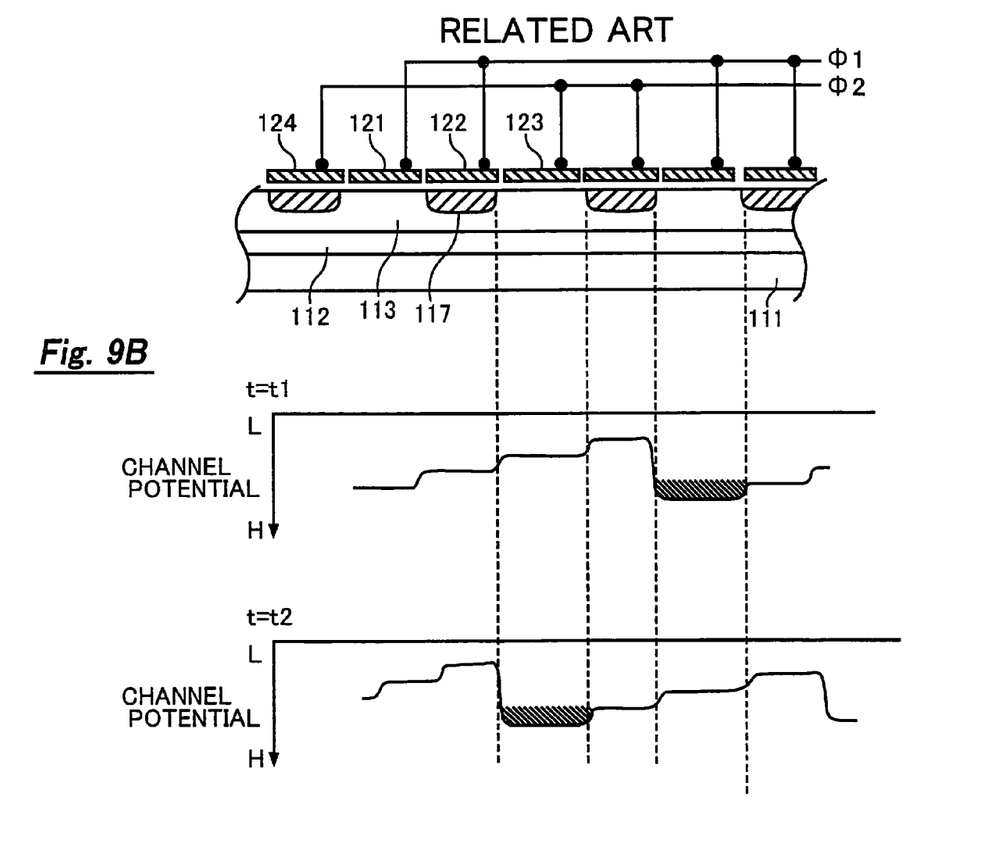
FIG. 9B is a potential diagram of a conventional CCD image sensor.

FIG. 9A is a chart showing the drive pulse timing in the CCD register 102. FIG. 9B is a view showing the potential in the cross section along the line 8C-8C of FIG. 7. As shown in FIG. 9B, at t=t1, the potential underneath the Φ1 storage electrode 121 is a high level (H) and electrons are accumulated there. At t=t2, the potential underneath the Φ1 storage electrode 121 becomes a low level (L) and the potential underneath the Φ2 barrier electrode 124 and the Φ2 storage electrode 123 becomes a high level and the electrons are transferred to underneath the Φ2 storage electrode 123 through underneath the Φ2 barrier electrode 124. Electrons are sequentially transferred in this way.

The advantage of the CCD image sensor of FIG. 7 is that the number of electrodes within the pitch L of a unit cell is half the number of the CCD image sensor of FIG. 6. The pitch L of a unit cell is thereby decreased to half under the same design rule, which doubles the resolution.

However, the CCD image sensor of FIG. 7 has the following problems. The electrons which are accumulated underneath the Φ1 storage electrode 121 in the area near the photodiode 100 are transferred to underneath the Φ2 storage electrode 123 through underneath the Φ2 barrier electrode 124 by the path Y in FIG. 7.

Thus, the longer the length of the Φ1 storage electrode 121 in the direction perpendicular to the photodiode line array is, the longer an effective transfer length or the entire length of a electron transfer path is. This weakens the transfer electric field underneath the Φ1 storage electrode 121 to deteriorate the electron transfer efficiency. This is the same in the case where electrons are transferred from underneath the Φ2 storage electrode 123 to underneath the Φ1 storage electrode 121 through underneath the Φ1 barrier electrode 122.

Other solid-state imaging apparatus having substantially the same configuration as FIG. 7 are Japanese Unexamined Patent Application Publication No. 58-137250 and Japanese Patent No. 2816063, for example.

As described above, the present invention has recognized that reduction of the pitch of cells to improve the resolution causes the entire length of the electron transfer path to increase, deteriorating the electron transfer efficiency.

SUMMARY OF THE INVENTION

According to one aspect of the present invention, there is provided a solid-state imaging apparatus which includes a photoelectric conversion section generating a charge by photoelectric conversion; and a charge transfer section having first and second transfer electrodes arranged in parallel with each other in an output direction of a charge generated by the photoelectric conversion section and repeatedly transferring the charge between a semiconductor region underneath the first transfer electrode and a semiconductor region underneath the second transfer electrode obliquely to an array direction of the first and second transfer electrodes to output the charge. Since this apparatus repeatedly transfers a charge between the first and second transfer electrodes arranged in parallel, the pitch of cells can be narrowed. Further, since a charge is transferred obliquely to the array direction of the first and second transfer electrodes, the entire charge transfer path is reduced to improve electron transfer efficiency.

According to another aspect of the present invention, there is provided a solid-state imaging apparatus which includes a plurality of photoelectric conversion sections generating a charge by photoelectric conversion; and a first transfer electrode array composed of a plurality of first transfer electrodes for transferring the charge, arranged in parallel with an array direction of the photoelectric conversion sections, and a second transfer electrode array composed of a plurality of second transfer electrodes for transferring the charge, arranged in parallel with the first transfer electrode array, wherein, in each of the first and the second transfer electrodes, two sides parallel to a direction perpendicular to the array direction of the photoelectric conversion sections have different lengths. Since this apparatus repeatedly transfers a charge between the first and second transfer electrodes arranged in parallel, the pitch of cells can be narrowed. Further, since a charge is transferred obliquely to the array direction of the first and second transfer electrodes, the entire charge transfer path is reduced to improve electron transfer efficiency.

According to still another aspect of the present invention, there is provided a solid-state imaging apparatus which includes a plurality of photoelectric conversion sections generating a charge by photoelectric conversion; and a plurality of first transfer electrodes arranged in parallel with an array direction of the photoelectric conversion sections, and a plurality of second transfer electrodes arranged in parallel with the array direction of the photoelectric conversion sections and adjacent to the first transfer electrodes, wherein the first and the second transfer electrodes are supplied with different drive signals for transferring the charge, and, when the first and the second transfer electrodes are supplied with the drive signals, a potential underneath the first and the second transfer electrodes is higher in an adjacent area of the first and the second transfer electrodes than in another area. Since this apparatus repeatedly transfers a charge between the first and second transfer electrodes arranged in parallel, the pitch of cells can be narrowed. Further, since a charge is transferred obliquely to the array direction of the first and second transfer electrodes, the entire charge transfer path is reduced to improve electron transfer efficiency.

The present invention provides a solid-state imaging apparatus and a charge transfer section with high electron transfer efficiency.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
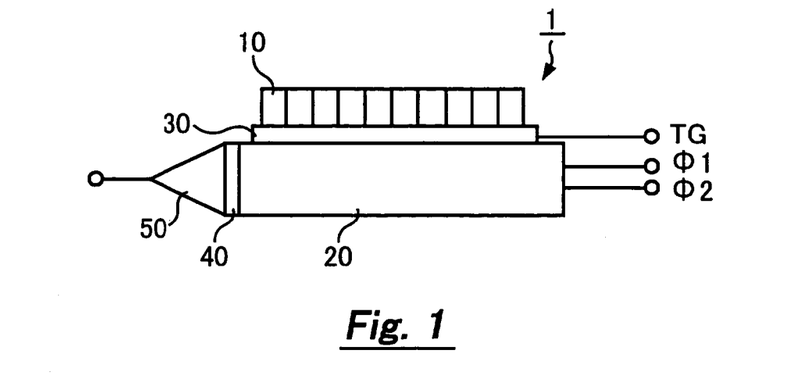
FIG. 1 is a schematic diagram of the CCD image sensor of this invention.
Figure 2:
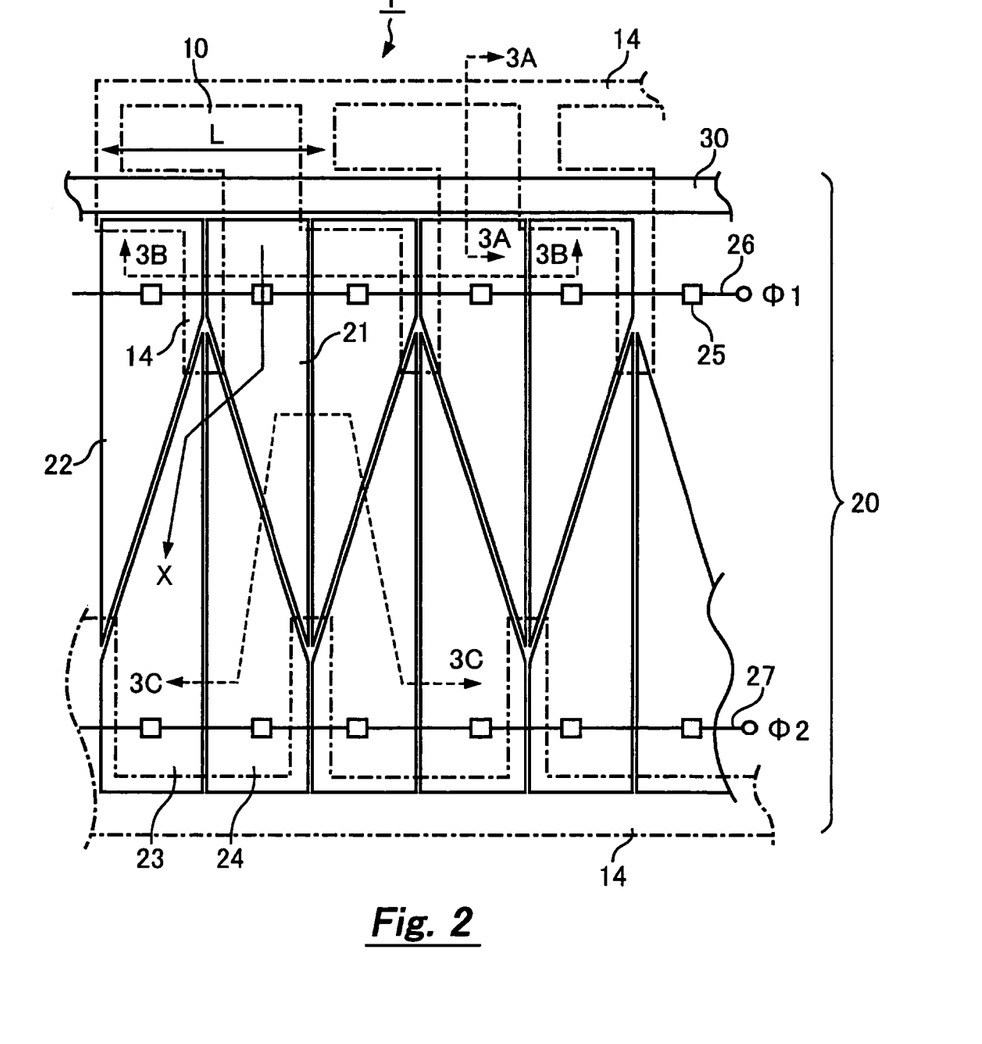
FIG. 2 is a plan view of the CCD image sensor of this invention.
Figure 3A:
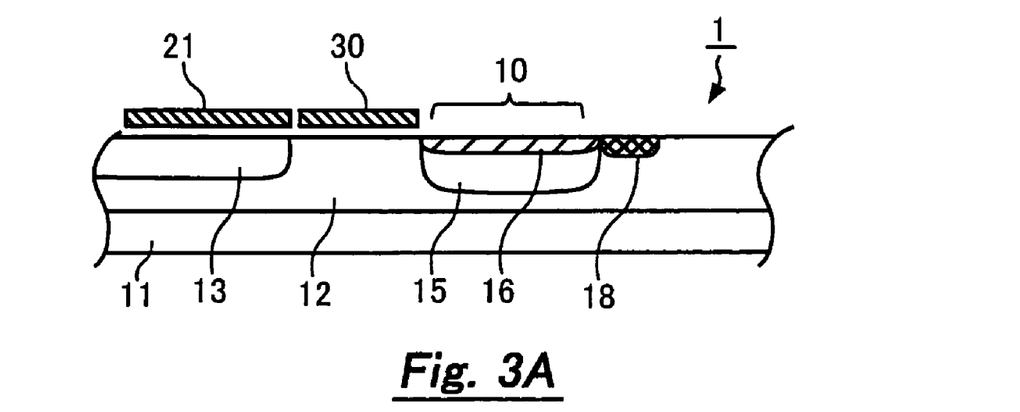
FIGS. 3A to 3C are cross-sectional views of the CCD image sensor of this invention.
Figure 3B:
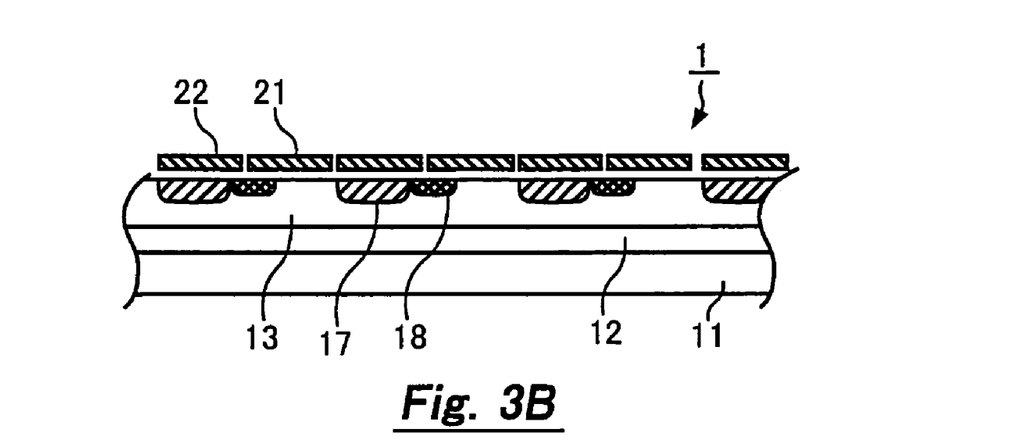
Figure 3C:
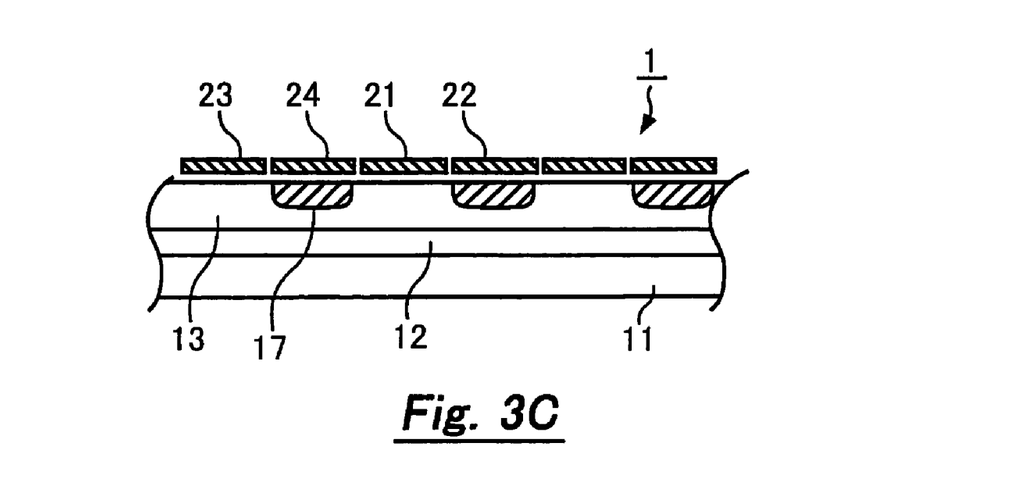

Referring first to FIGS. 1 to 3, the configuration of a CCD image sensor of the present invention is explained.

FIG. 1 is a schematic diagram of the CCD image sensor of this invention. The CCD image sensor 1 includes photodiodes 10, a transfer gate electrode 30, a CCD register 20, a charge detection section 40, and an output circuit 50. The photodiode 10 is a photoelectric conversion section that generates a charge by photoelectric conversion. The transfer gate electrode 30 is an electrode that passes the charge generated by the photodiodes 10 to the CCD register 20. The CCD register 20 is a charge transfer section or a charge transfer device that transfers the charge generated by the photodiode 10. The charge detection section 40 is a circuit that detects the charge transferred from the CCD register 20. The output circuit 50 is a circuit that outputs a signal according to the charge detected by the charge detection section 40 to the outside.

The CCD image sensor 1 is a one-dimensional image sensor. A plurality of photodiodes 10 are arranged in one direction to form a photodiode line array. The photodiode line array consisting of the photodiodes 10, the transfer gate electrode 30, and the CCD register 20 are arranged in parallel, with the transfer gate electrode 30 placed between the photodiode line array and the CCD register 20. Thus, the transfer gate electrode 30 is adjacent to the photodiodes 10. The CCD register 20 is placed at the side of the transfer gate electrode 30 opposite to the side adjacent to the photodiodes 10. The charge detection section 40 is placed at the side of the CCD register 20 to which a charge is transferred. The charge detection section 40 is connected to the output circuit 50.

If a drive pulse TG is applied to a TG terminal, the signal charge which is photoelectrically converted and accumulated in the photodiodes 10 is read out to the CCD register 20 via the transfer gate electrode 30. Further, if drive pulses Φ1 and Φ2 are applied to a Φ1 terminal and a Φ2 terminal, respectively, the signal charge read out from the photodiodes 10 is transferred to the charge detection section 40 by the CCD register 20, where the signal charge is converted to a voltage. A voltage change in the charge detection section 40 is output to the outside via the output circuit 50 composed of a source follower amplifier, an inverter, and so on.

FIG. 2 is a plan view of the CCD image sensor of this embodiment. FIG. 2 is an enlarged view of the photodiodes 10, the transfer gate electrode 30, and the CCD register 20 of the CCD image sensor 1 shown in FIG. 1.

As shown in FIG. 2, the photodiodes 10 are separated from each other by an element separating region 14 formed of a p+ type diffusion layer. The CCD register 20 includes four types of electrodes 21 to 24. The electrode 21 is a Φ1 storage electrode, the electrode 22 is a Φ1 barrier electrode, the electrode 23 is a Φ2 storage electrode, and the electrode 24 is a Φ2 barrier electrode.

The storage electrode and the barrier electrode receive the same drive pulse and transfer electrons in a pair. Since the potential underneath the barrier electrode is lower than the potential underneath the storage electrode, potential gradient occurs to transfer the electrons from underneath the barrier electrode to underneath the storage electrode.

The Φ1 storage electrodes 21 and the Φ1 barrier electrodes 22 are arranged alternatively and repeatedly. The Φ2 storage electrodes 23 and the Φ2 barrier electrodes 24 are also arranged alternatively and repeatedly. The electrode line array consisting of the Φ1 storage electrodes 21 and the Φ1 barrier electrodes 22, and the electrode line array consisting of the Φ2 storage electrodes 23 and the Φ2 barrier electrodes 24 are placed along the electron output direction or the direction to which the charge detection section 40 is placed, and they are parallel with the photodiode line array in this case. The Φ1 storage electrodes 21 and the Φ2 barrier electrodes 24 are placed opposite to each other in the direction perpendicular to the array direction of the Φ1 storage electrode 21 and the Φ1 barrier electrode 22, or the Φ2 storage electrode 23 and the Φ2 barrier electrode 24. The Φ1 barrier electrode 22 and the Φ2 storage electrode 23 are also placed opposite to each other in the same manner. For example, Electrons are repeatedly transmitted between the area underneath the electrode line array of the Φ1 storage electrode 21 and the Φ1 barrier electrode 22 and the area underneath the electrode line array of the Φ2 storage electrode 23 and the Φ2 barrier electrode 24 and then output to the charge detection section 40.

If the pitch L of a unit cell of the photodiode 10 in the photodiode line array is L, two electrodes of the electrodes 21 to 24 correspond to the pitch L. Thus, it is possible to reduce the pitch L of a unit cell as is the case with the conventional CCD image sensor of FIG. 7 to improve the resolution. Further, though FIG. 2 shows the case where the electrodes 21 and 22, and the electrodes 23 and 24 are each separated in order to simplify the description, those electrodes may be connected. For example, the electrode 21, 22, 23, and 24 may be a first, a second, a third, and a fourth transfer electrode, respectively; alternatively, the electrodes 21 and 22 together may serve as a first transfer electrode, and the electrodes 23 and 24 may together serve as a second transfer electrode.

Since electrons are transferred from the barrier electrode to the storage electrode, the element separating region 14 is placed in the boundary area between the Φ1 barrier electrode 22 and the Φ1 storage electrode 21 which has the Φ1 barrier electrode 22 to the left (the electron output direction) and the Φ1 storage electrode 21 to the right (opposite from the electron output direction). The element separating region 14 is also placed in the boundary area between the Φ2 barrier electrode 24 and the Φ2 storage electrode 23 which has the Φ2 barrier electrode 24 to the left and the Φ2 storage electrode 23 to the right. The transfer channel or transfer path of the CCD register 20 is thereby not straight but curved meandering, zigzag, or s-shaped.

The Φ1 storage electrode 21 and the Φ1 barrier electrode 22 are connected to a metal line 26 by a contact 25 to receive a drive pulse Φ1 from a Φ1 terminal. Similarly, the Φ2 storage electrode 23 and the Φ2 barrier electrode 24 are connected to a metal line 27 to receive a drive pulse Φ2. For example, two drive pulses Φ1 and Φ2, which are clock pulses with 180° phase difference from each other, are applied to the Φ1 terminal and the Φ2 terminal, respectively. The potential underneath the electrodes 21 to 24 thereby changes to sequentially transfer electrons from right to left of FIG. 2, through the Φ1 storage electrode 21, the Φ2 barrier electrode 24, the Φ2 storage electrode 23, and the Φ1 barrier electrode 22.

In this embodiment, the facing sides (adjacent sides) of the Φ1 storage electrode 21 and the Φ2 barrier electrode 24, and the facing sides of the Φ1 barrier electrode 22 and the Φ2 storage electrode 23, each electrode pair receiving different clock pulses, are not parallel with the electron output direction or the photodiode line array direction, thereby increasing the length of the facing sides. In each electrode, two sides parallel to a direction perpendicular to the array direction of the photodiode line array have different lengths. In each electrode, the side in the middle part of the CCD register 20 is longer than the opposite side. Further, a part of the facing side (the side in the middle part of the CCD register 20) of each electrode is located closer to one end or the opposite end of the CCD register 20 than the substantially middle part of the CCD register 20. Thus, each electrode is not a rectangular shape, but a shape including an oblique line. Electrons are transferred perpendicular to the oblique line. Specifically, the electrons are not transferred as turning at a right angle with respect to the photodiode line array as in FIG. 7, but transferred as turning at an oblique angle with respect to the photodiode line array in the electron output direction. Hence, transfer of electrons is repeated obliquely with respect to the direction of the electrode line array consists of the electrodes 21 and 22 in the first semiconductor region and the electrode line array consists of the electrodes 23 and 24 in the second semiconductor region. This reduces an effective electron transfer length or the entire length of an electron transfer path.

The shape of each electrode is not limited to the above example. The facing sides of the Φ1 storage electrode 21 and the Φ2 barrier electrode 24 and the facing sides of the Φbarrier electrode 22 and the Φ2 storage electrode 23 are not necessarily oblique, as long as they are longer than one end of the CCD register 20 near the photodiode line array or the other end of the CCD register 20 in the opposite side from the photodiode line array. For example, the facing sides may be an irregular shape with a given number of depressions and recesses, a S-shape, or a zigzag shape.

FIGS. 3A to 3C are cross-sectional views along the lines 3A-3A, 3B-3B, and 3C-3C in FIG. 2, respectively, of the CCD image sensor of this embodiment. As shown in FIG. 3A, a p-type well 12 is formed on one principal surface of an n-type substrate 11. In the p-type well 12, an n well 13 which serves as a transfer channel of the CCD register 20, a p+ type diffusion layer 18 which serves as the element separating region 14, and an n type diffusion layer 15 which serves as a charge accumulation layer of the photodiode 10 are formed. A transfer gate electrode 30 is formed above the p-type well 12 between the n type well 13 and the n type diffusion layer 15.

In the photodiode 10, a charge is accumulated as time passes despite that light is blocked, which is called a dark current. In order to reduce the dark current, a p+ type diffusion layer 16 is formed on the surface of the n type diffusion layer 15.

For example, in the photodiode 10, the electrons which are photoelectrically converted are accumulated in accordance with the received light amount in the n type diffusion layer 15. Receiving a drive pulse TG, the transfer gate electrode 30 is turned on and the accumulated electrons are transferred to underneath the Φ1 storage electrode 21 through underneath the transfer gate electrode 30.

As shown in FIGS. 3B and 3C, an n− type diffusion layer 17 is formed in the n type well 13 by partial boron ion implantation or the like. The n− type diffusion layer 17 serves as a barrier region. The Φ1 storage electrode 21 and the Φ2 storage electrode 23 are formed above the n type well 13, and the Φ1 barrier electrode 22 and the Φ2 barrier electrode 24 are formed above the n− type diffusion layer 17. Due to the presence of the n− type diffusion layer 17, the voltage potential underneath the barrier electrodes is lower than the voltage potential underneath the storage electrodes.

In the part where a p+ type diffusion layer 18 is formed between the parts underneath the Φ1 barrier electrode 22 and the Φ1 storage electrode 21, transfer of electrons is blocked by the p+ type diffusion layer 18.

Figure 4A:
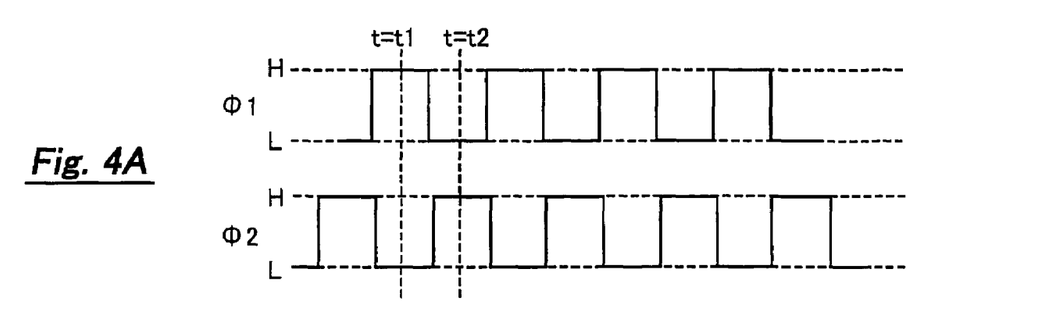
FIG. 4A is a drive pulse timing chart of the CCD image sensor of this invention.
Figure 4B:
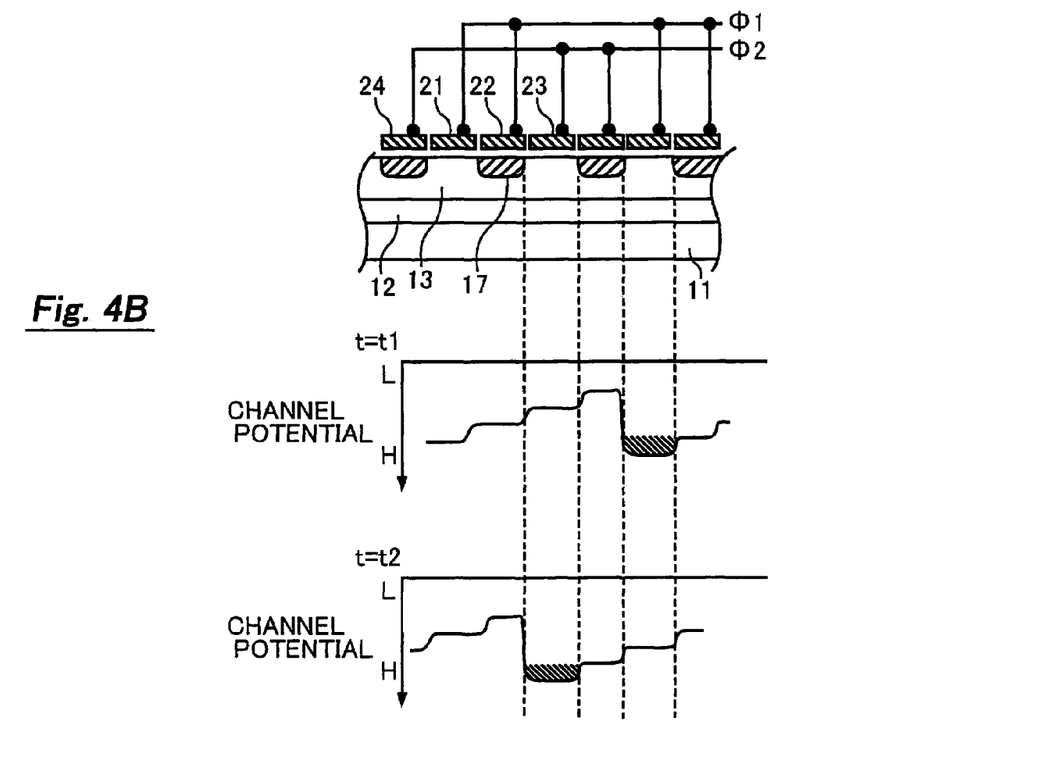
FIG. 4B is a potential diagram of the CCD image sensor of this invention.

Referring then to FIGS. 4A and 4B, the operation of the CCD image sensor of this embodiment is described. FIG. 4A is a timing chart of a drive pulse in the CCD register 20, and FIG. 4B is a diagram showing the potential in the cross section along the line 3C-3C of FIG. 2.

As described above, the CCD image sensor 1 is a two-phase drive image sensor driven by the drive pulses Φ1 and Φ2. As shown in FIG. 4A, the drive pulses Φ1 and Φ2 have 180° phase difference from each other; thus, when one is a low level (L), the other is a high level (H).

At t=t1, a high level drive pulse is applied to the Φ1 storage electrode 21 and the Φ1 barrier electrode 22, and a low level drive pulse is applied to the Φ2 storage electrode 23 and the Φ2 barrier electrode 24. Thus, as shown in FIG. 4B, the potential underneath the Φ1 storage electrode 21 is a high level with the electrons accumulated there.

At t=t2, a low level drive pulse is applied to the Φ1 storage electrode 21 and the Φ1 barrier electrode 22, and a high level drive pulse is applied to the Φ2 storage electrode 23 and the Φ2 barrier electrode 24. Thus, as shown in FIG. 4B, the potential underneath the Φ1 storage electrode 21 is a low level, and the potential underneath the Φ2 barrier electrode 24 and the Φ2 storage electrode 23 are a high level, and the electrons are transferred to underneath the Φ2 storage electrode 23 through underneath the Φ2 barrier electrode 24. The electrons are sequentially transferred in this way.

As described earlier, the facing sides of the storage electrode and the barrier electrode to which different clock pulses are applied are not parallel with the electron output direction or the photodiode line array direction, thereby increasing the length of the facing sides. With the long facing sides, a greater number of electrons can be transferred efficiently. The electrons accumulated underneath the Φ1 storage electrode 21 in the area near the photodiode 10 are transferred to underneath the Φ2 storage electrode 23 through the Φ2 barrier electrode 24 by the path X in FIG. 2. Thus, the effective transfer length in the Φ1 storage electrode 21 is half or less than half of the length in the conventional CCD image sensor of FIG. 7, and the transfer electric field underneath the Φ1 storage electrode 21 is stronger, thereby significantly improving the transfer efficiency.

The same advantage can be obtained when transferring electrons from underneath the Φ2 storage electrode 23 to underneath the Φ1 storage electrode 21 through the Φ1 barrier electrode 22. Hence, high-speed transfer and high-resolution can be achieved at the same time.

As described in the foregoing, this embodiment can provide a CCD image sensor with high resolution and high transfer efficiency under the same design rule as conventional techniques.

Second Embodiment

Figure 5:
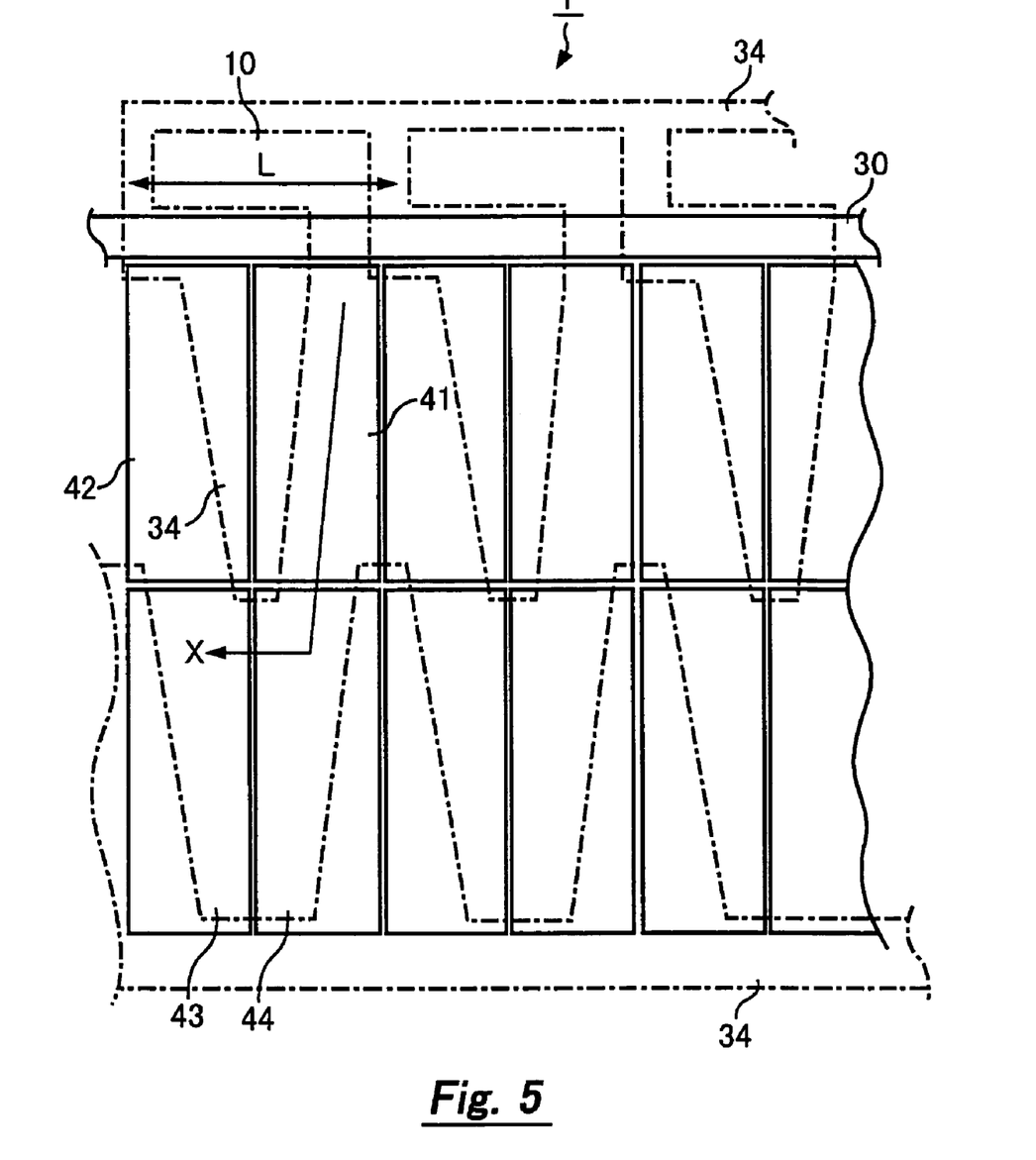
FIG. 5 is a plan view of the CCD image sensor of this invention.

Referring now to FIG. 5, the configuration of the CCD image sensor according to a second embodiment of the invention is described. FIG. 5 is a plan view of the CCD image sensor of the second embodiment. Like FIG. 2, FIG. 5 is an enlarged view of the photodiodes 10, the transfer gate electrode 30, and the CCD register 20 of the CCD image sensor 1 shown in FIG. 1.

In FIG. 5, the same reference symbols as in FIG. 2 designate the same elements. Though the illustration of the contact 25 and the metal lines 26 and 27 are omitted in FIG. 5, the configuration is the same as in FIG. 2. The operation is the same as in FIGS. 4A and 4B if the electrodes 21 to 24 are replaced by electrodes 41 to 44.

The electrodes 41 to 44 have a rectangular shape as in the CCD image sensor of FIG. 7. The facing sides of the Φ1 storage electrode 41 and the Φ2 barrier electrode 44, and the facing sides of the Φ1 barrier electrode 42 and the Φ2 storage electrode 43 are parallel with the electron output direction or the photodiode line array direction. Though FIG. 5 shows the case where the electrodes 41 and 42, and the electrodes 43 and 44 are each separated in order to simplify the description, those electrodes may be connected. The electrodes 41 to 44 do not necessarily have the shape shown in this example, and they may have the same shape as shown in FIG. 2.

Just like the configuration of FIG. 2, an element separating region 34 is formed in the area having the Φ1 barrier electrode 42 to the left (in the electron output direction) and the Φ1 storage electrode 41 to the right (opposite to the electron output direction). The element separating region 34 is also formed in the area having the Φ2 barrier electrode 44 to the left and the Φ2 storage electrode 43 to the right. Thus, the element separating region 34 is formed in the boundaries between the storage electrodes and the barrier electrodes to which the same clock pulses are applied which have the barrier electrode to the side closer to the output circuit 50. The transfer channel of the CCD register 20 therefore has a meandering shape.

This embodiment is different from the above embodiment in the shape of the element separating region 34. The element separating region 34 extends from one end of the CCD register 20 near the photodiode line array and from the opposite end of the CCD register 20 to the middle part of the CCD register 20. The sides of the element separating region 34 extending from one end and the opposite end to the middle part of the CCD register 20 are oblique to the electron output direction or the photodiode line array direction and also oblique to the direction perpendicular to the electron output direction.

Further, the width of the element separating region 34 becomes narrower as it approaches to the middle part from one end or the opposite end of the CCD register 20. Thus, the channel width for transferring electrons from the electrode 41 to the electrode 44, or from the electrode 43 to the electrode 42 becomes wider to the middle part from one end or the opposite end of the CCD register 20. Thus, the potential in the middle part of the CCD register 20 is higher than the potential in the one end or the opposite end of the CCD register 20 due to narrow channel effects. The voltage in the adjacent area of the electrode line array consisting of the electrodes 41 and 42 in the first semiconductor region and the electrode line array consisting of the electrodes 43 and 44 in the second semiconductor region is higher than the voltage in the non-adjacent area. The transfer electric field underneath the Φ1 storage electrode 41 and the Φ2 storage electrode 43 is thereby stronger than that in the conventional CCD image sensor of FIG. 7 so that the transfer efficiency is improved.

The position where electrons are accumulated when a high-level drive pulse is applied to the storage electrode is described below. In the CCD image sensor 1 of FIG. 2, the channel width is greater in one end and the opposite end than in the middle part of the CCD register 20 due to the electrode shape. The narrow channel effect by the electrode shape results in that electrons are likely to be accumulated in both ends away from the middle part of the CCD register 20 underneath the storage electrode.

On the other hand, in this embodiment, the narrow channel effect by the shape of the element separating region 34 results in that electrons are likely to be accumulated in the middle part of the CCD register 20 underneath the storage electrode. Thus, the effective transfer length from the part where electrons are accumulated to the electrode where the electrons are to be transferred next is shorter in this embodiment. Hence, especially when the number of electrons is small, this embodiment, which has the shorter effective transfer length, allows a higher transfer efficiency.

Though the narrow channel effect is produced by the shape of the element separating region 34 in this embodiment, it may be caused by another way. For example, the width of the entire electrode may be increased to the middle part of the CCD register 20. Further, the potential gradient may be created not by the narrow channel effect, but by another way such as by use of a diffusion layer.

Other Embodiments

Though the above embodiments describe the CCD register in a one-dimensional CCD image sensor, it is not limited thereto, and the CCD register may be used in another type of CCD image sensor. For example, this invention may be applied to a horizontal CCD register of a two-dimensional image sensor which includes photodiodes and a vertical CCD in the pitch L of a unit cell. This invention may be also applied to a horizontal CCD register of a two-dimensional CCD image sensor which includes only a vertical CCD in the pitch L of a unit cell.

Further, though the above embodiments describe the two-phase drive CCD image sensor, it is not limited thereto, and a CCD image sensor of another drive type may be produced. For example, the CCD image sensor may be a single-phase drive type in which a constant direct-current voltage is applied to one of the drive terminals Φ1 and Φ2 and the above drive pulse is applied to the other one of the drive terminals Φ1 and Φ2. Furthermore, the CCD image sensor may be a four-phase drive type further having drive pulses Φ3 and Φ4 so as to apply a different drive pulse to each electrode. In this case, the voltage potential underneath the storage electrode and the barrier electrode may be equal.

It is apparent that the present invention is not limited to the above embodiment that may be modified and changed without departing from the scope and spirit of the invention.

What is claimed is:

1. A meander channel solid state imaging apparatus, comprising:

a photoelectric conversion section generating a charge by photoelectric conversion; and a charge transfer section that transfers the charge generated by said photoelectric conversion section in a first direction, said charge transfer section comprising a meander channel with plural cells in a linear array extending in the first direction, each of said cells having a first transfer electrode and a second transfer electrode that each has a first side perpendicular to the first direction and a second side perpendicular to the first direction and a third side parallel to the first direction and joining said first and second sides, said first sides of said first and second transfer electrodes being collinear and said second sides of said first and second transfer electrodes being collinear, said first and second transfer electrodes each having a fourth side opposite said third side that also joins said first and second sides, said fourth sides of said first and second transfer electrodes facing each other and being spaced apart from each other to separate said first and second transfer electrodes from each other, and a semiconductor region beneath said cells and an element separation region in said semiconductor region that defines a charge transfer channel, said element separation region having projections extending from said third side less than one half a length of said cells measured perpendicular to the first direction, wherein said fourth side is longer than said third side, wherein said fourth side in each of said plural cells is transverse to said fourth side of an adjacent one of said cells so that said fourth sides define a zig-zag pattern extending across said plural cells in the first direction, and wherein said element separation region extends to said fourth side so that a width of the charge transfer channel increases from said third side to said fourth side.

2. The solid state imaging apparatus of claim 1, wherein said fourth side is oblique to the first direction and to said first side along an entire length of said fourth side.

3. The solid state imaging apparatus of claim 1, wherein said first side of said first transfer electrode is longer than said second side of said first transfer electrode.

4. The solid state imaging apparatus of claim 3, wherein said second side of said second transfer electrode is longer than said first side of said second transfer electrode.

5. The solid state imaging apparatus of claim 3, wherein said second side of said second transfer electrode is about a same length as said first side of said first transfer electrode.

6. The solid state imaging apparatus of claim 1, wherein said first transfer electrode is connected to a first drive signal and said second transfer electrode is connected to a second drive signal different from the first drive signal.

7. A meander channel solid state imaging apparatus, comprising:
- a photoelectric conversion section generating a charge by photoelectric conversion;
- a charge transfer section that transfers the charge generated by said photoelectric conversion section in a first direction,
- said charge transfer section comprising a meander channel with plural cells in a linear array extending in the first direction, each of said cells having a first transfer electrode and a second transfer electrode that each has a first side perpendicular to the first direction and a second side perpendicular to the first direction and a third side parallel to the first direction and joining said first and second sides, said first sides of said first and second transfer electrodes being collinear and said second sides of said first and second transfer electrodes being collinear, said first and second transfer electrodes each having a fourth side opposite said third side that also joins said first and second sides, said fourth sides of said first and second transfer electrodes facing each other and being spaced apart from each other to separate said first and second transfer electrodes from each other; and
- a first element separation region in a semiconductor region beneath said second side of said first transfer electrode, said first element separation region having a first edge defining a side of a charge transfer channel, said first edge extending from said third side to said fourth side of said first transfer electrode and being oblique to the first direction and to said second side so that a width of said charge transfer channel increases from said third side to said fourth side of said first transfer electrode.

8. The solid state imaging apparatus of claim 7, further comprising a second element separation region in a semiconductor region beneath said first side of said second transfer electrode, said second element separation region having a second edge defining another side of said charge transfer channel, said second edge extending from said third side to said fourth side of said second transfer electrode and being oblique to the first direction and to said first side so that a width of said charge transfer channel increases from said third side to said fourth side of said second transfer electrode.

9. A meander channel solid state imaging apparatus, comprising:
- a photoelectric conversion section generating a charge by photoelectric conversion; and
- a charge transfer section that transfers the charge generated by said photoelectric conversion section in a first direction,
- said charge transfer section comprising a meander channel with plural cells in a linear array extending in the first direction, each of said plural cells having a first transfer electrode and a second transfer electrode that are arranged perpendicular to the first direction, each of the first and second transfer electrodes having a first side perpendicular to the first direction, a second side perpendicular to the first direction, a third side parallel to the first direction and joining said first and second sides, and a fourth side opposite said third side that also joins said first and second sides, said first sides of said first and second transfer electrodes being collinear, said second sides of said first and second transfer electrodes being collinear, and said fourth sides of said first and second transfer electrodes facing each other and being spaced apart from each other to separate said first and second transfer electrodes from each other,
- wherein said fourth side is longer than said third side, and
- wherein said fourth side in each of said plural cells is transverse to said fourth side of an adjacent one of said cells so that said fourth sides define a zigzag pattern extending across said plural cells in the first direction.

10. The solid-state imaging apparatus of claim 9, wherein said fourth side is oblique to the first direction and to said first and second sides.

11. The solid-state imaging apparatus of claim 9, wherein said first side of said first transfer electrode is longer than said second side of said first transfer electrode.

12. The solid-state imaging apparatus of claim 11, wherein said second side of said second transfer electrode is longer than said first side of said second transfer electrode.

13. The solid-state imaging apparatus of claim 11, wherein said second side of said second transfer electrode is about a same length as said first side of said first transfer electrode.

14. The solid-state imaging apparatus of claim 9, wherein said first transfer electrode is connected to a first drive signal and said second transfer electrode is connected to a second drive signal different from the first drive signal.

15. The solid-state imaging apparatus of claim 9, further comprising a semiconductor region beneath said plural cells and an element separation region in said semiconductor region that defines a charge transfer channel, said element separation region having projections extending from said third side to said fourth side so that a width of the charge transfer channel increases from said third side to said fourth side.

16. The solid-state imaging apparatus of claim 15, wherein each of said projections extends from said third side less than one half a length of said plural cells when measured in the first direction.

* * * * *